United States Patent
Kyowski et al.

(10) Patent No.: US 9,696,860 B2
(45) Date of Patent: Jul. 4, 2017

(54) CAPACITIVE TOUCH SENSOR

(71) Applicant: BlackBerry Limited, Waterloo (CA)

(72) Inventors: Timothy Herbert Kyowski, Kitchener (CA); Li Huang, Kitchener (CA); Albert Murray Pegg, Breslau (CA)

(73) Assignee: BlackBerry Limited, Waterloo, Ontario (CA)

( * ) Notice: Subject to any disclaimer, the term of this patent is extended or adjusted under 35 U.S.C. 154(b) by 207 days.

(21) Appl. No.: 14/479,609

(22) Filed: Sep. 8, 2014

(65) Prior Publication Data

US 2016/0070379 A1   Mar. 10, 2016

(51) Int. Cl.
| | |
|---|---|
| *G06F 3/02* | (2006.01) |
| *G06F 3/045* | (2006.01) |
| *G06F 3/044* | (2006.01) |
| *G06F 1/16* | (2006.01) |
| *H03K 17/96* | (2006.01) |

(52) U.S. Cl.
CPC ............. *G06F 3/044* (2013.01); *G06F 1/169* (2013.01); *G06F 1/1626* (2013.01); *G06F 3/0202* (2013.01); *H03K 17/962* (2013.01); *H03K 2017/9602* (2013.01)

(58) Field of Classification Search
None
See application file for complete search history.

(56) References Cited

U.S. PATENT DOCUMENTS

| | | |
|---|---|---|
| 5,650,597 A | 7/1997 | Redmayne |
| 6,319,564 B1 | 11/2001 | Naundorf et al. |
| 6,961,049 B2 | 11/2005 | Mulligan et al. |
| 7,060,421 B2 | 6/2006 | Naundorf et al. |
| 8,558,796 B2 | 10/2013 | Giancarlo et al. |
| 9,001,082 B1* | 4/2015 | Rosenberg ............ G06F 3/0414 178/18.05 |
| 2006/0097992 A1* | 5/2006 | Gitzinger ................ G06F 3/044 345/173 |
| 2013/0021278 A1* | 1/2013 | Landau ................... G06F 3/044 345/173 |
| 2013/0100030 A1* | 4/2013 | Los ......................... G06F 3/023 345/169 |

(Continued)

OTHER PUBLICATIONS

Liddle, J., "Using Laser Direct Structuring (LDS) to Create Robust Hardware Security Devices", Defense Tech Briefs, vol. 6, No. 5, Oct. 2012.

(Continued)

*Primary Examiner* — Christopher R Lamb
(74) *Attorney, Agent, or Firm* — Thomas Grzesik; Fleit Gibbons Gutman Bongini & Bianco P.L.

(57) ABSTRACT

The present disclosure provides a capacitive touch sensor for an electronic device. The touch sensor has a trace carrier having a sensing surface, a connecting surface, and a number of electrically conductive traces on the trace carrier. The traces form a sensing pattern on the sensing surface and pass from the sensing surface to the connecting surface. The sensor also includes a capacitive sensing circuit operable to electrically couple to the traces at the connecting surface of the trace carrier, and to sense a capacitance change. A touch position on the sensing surface is determined dependent upon the sensed capacitance change.

20 Claims, 7 Drawing Sheets

(56) References Cited

U.S. PATENT DOCUMENTS

2014/0055363 A1    2/2014  Meierling et al.

OTHER PUBLICATIONS

Pratt, Susan, "Capacitance Sensors for Human Interfaces to Electronic Equipment", Analog Dialogue 40-10, www.analog.com/analogdialogue, Oct. 2006.
LPKF Laser & Electronics, "LPKF-LDS for Moulded Interconnect Devices", http://www.lpkf.com/applications/mid/lpkf-lds-process/, http://www.youtube.com/watch?v=JvggSBXInO , video uploaded Dec. 3, 2009.

* cited by examiner

CAPACITIVE TOUCH SENSOR

BACKGROUND

Mechanical keyboards are commonly used to enter information in electronic devices. More recently, to save weight and reduce size, or maximize display area, many small electronic devices have switched to virtual keyboards displayed on a touch sensitive display, such as a capacitive display.

Capacitive touch sensors are used in many applications. For example, flat surfaces such as touch sensitive displays or touch pads are commonly used to provide user input to electronic devices such as computers, smartphones, and other electronic devices. A disadvantage of such devices is that, while they provide visual feedback of position, they fail to provide any tactile feedback to the user.

In an attempt to provide the benefits of a touch sensitive input for capture gestures and the accuracy and tactile feedback of a mechanical keyboard, a capacitive sensing surface has been used beneath a mechanical tactile keyboard to provide a combination of touch input and key input to electronic devices. A disadvantage of such an approach is that any spilled liquid or moisture on the keyboard will prevent operation of the capacitive sensing surface, and the presence of the keyboard prevents easy removal of the liquid. A further disadvantage of this approach is that the touch sensitive surface is separated from the user by the keycaps which reduces both sensitivity and accuracy of touch detection.

It would be useful, therefore, to provide an improved capacitive touch sensor and an alternative method to equip a mechanical keypad with touch functions and less sensitive to water residual. It is also promising to improve the horizontal resolution and sensitivity.

BRIEF DESCRIPTION OF THE DRAWINGS

Exemplary embodiments of the present disclosure will be described below with reference to the included drawings such that like reference numerals refer to like elements and in which.

DETAILED DESCRIPTION

Figure 1:
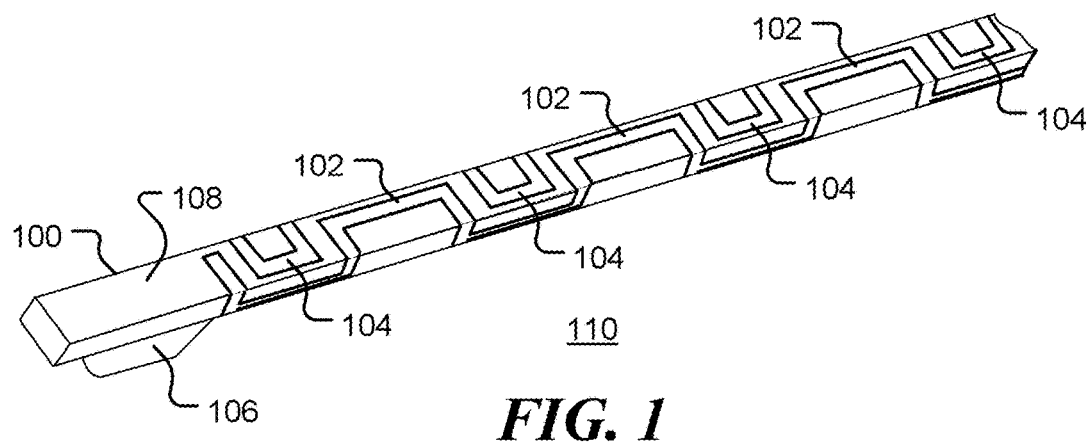
FIG. 1 is a diagrammatic view of a touch sensitive element in accordance with exemplary embodiments of the present disclosure.

For simplicity and clarity of illustration, reference numerals may be repeated among the figures to indicate corresponding or analogous elements. Numerous details are set forth to provide an understanding of the illustrative embodiments described herein. The embodiments may be practiced without these details. In other instances, well-known methods, procedures, and components have not been described in detail to avoid obscuring the disclosed embodiments. The description is not to be considered as limited to the scope of the embodiments shown and described herein.

Capacitive touch sensors detect touch by measuring the capacitance at each addressable electrode. When a finger or a conductive stylus gets close to an electrode, it modifies the electromagnetic field and changes the capacitance. This change in capacitance can be measured and converted into X,Y locations used for the system to detect touch. There are two main types of sensing methods, self-capacitance and mutual capacitance. Mutual capacitance determines the touch by measuring capacitance change between two electrodes, one in output mode (transmitter) and one in the return path (receiver). Self-capacitance touch sensor measures capacitance change between the electrode and the ground.

A mechanical keyboard may be combined with a touch sensitive surface to provide both key and touch inputs to an electronic device. For example, a flexible printed circuit (FPC) with discrete traces may be positioned beneath the keys of a physical keyboard. One disadvantage of such an approach is that when liquid resides on the top of the keycaps of the physical keyboard or in the gaps between the keys, operational of the touch sensitive surface is impaired. Since the presence of the keys makes it difficult to remove the liquid from the touch sensitive surface, a user of the electronic device has to wait until the liquid evaporates. Attempts to reduce the impact from water ingress include adding a thin rubber layer into touch surface/keyboard stack. However, in addition to increasing the thickness of the electronic device, this also increases manufacturing costs.

The present disclosure relates to a capacitive touch sensor for an electronic device that includes a trace carrier having a sensing surface and a connecting surface, a plurality of electrically conductive traces on the trace carrier and a capacitive sensing circuit operable to electrically couple to the traces at the connecting surface of the trace carrier, sense a capacitance change when a touch takes place. Each trace forms a sensing pattern on the sensing surface and passes from the sensing surface to the connecting surface. If mutual capacitance touch sensing is used, the traces include at least one transmitting trace and at least one receiving trace.

The capacitive touch sensor may also include a connecting structure configured to contact the electrically conductive traces at the connecting surface of the trace carrier and provide an electrical connection between the capacitive sensing circuit and the electrically conductive traces. The connecting structure may be, for example, a flexible printed circuit or a printed circuit board, where the trace carrier is mechanically coupled to the printed circuit.

The trace carrier may be constructed of a material amenable to Laser Direct Structuring, and the traces may be formed by a Laser Direct Structuring process.

A cover or a coating may be used to cover at least the sensing surface of the trace carrier.

The capacitive touch sensor may be used in an input apparatus for an electronic device. The input apparatus includes a keyboard having one or more keycaps, a connecting structure underlying the keyboard, and one or more trace carriers located on the connecting structure adjacent the keycaps of the keyboard. The trace carrier may be positioned such that a sensing surface of the trace carrier projects above the connecting structure and a connecting surface of trace support element engages the connecting structure to couple the traces to a capacitive sensing circuit The keycaps may be arranged in rows, with the trace carrier configured as a fret and sized to fit between rows of keycaps.

The keycaps may be arranged in an array, with the trace carrier configured as a grid and sized to fit between rows and columns of keycaps.

Alternatively, the one or more keycaps may be a single button, with the trace carrier configured to surround the button.

The capacitive touch sensor may be used in an electronic device, with the trace carrier projecting from the surface of the electronic device or adjacent to keyboard keycaps of a keyboard of the electronic device.

FIG. 1 is a diagrammatic view of a capacitive touch sensitive element or in accordance with exemplary embodiments of the present disclosure. Referring to FIG. 1, the touch sensitive element includes a trace carrier 100, first electrically conducting trace 102 and second electrically conducting trace 104. Optionally, a guide and assembling element 106 may be providing to facilitate accurate placement of the trace carrier 100 on base structure, and can make a rigid connection to base, such as heat staking. The trace support element 100 has a sensing surface 108 configured to receive a user touch. The combination of the trace support element 100 and the traces 102 and 104 form touch sensitive element 110

In the exemplary embodiment shown in FIG. 1, the trace carrier 100 is configured as a straight bar or fret. However, other shapes may be used with departing from the present disclosure. The traces may be formed by various techniques. In one embodiment, for example, Laser Direct Structure (LDS) technology is used to create trace patterns on a plastic trace carrier. This approach enables the trace carrier to be molded into any shape.

LDS technology uses a laser beam to create a trace pattern on the surface of 3-dimensional parts molded from an LDS resin. The process consists of molding, laser structuring to define the locations of the traces, and metallization to form the traces themselves. LDS technology enables 3-dimensional circuitry, in this case one or more traces, to be formed directly onto plastic components.

In an example embodiment, the trace carriers to be laser structured are produced using 1-shot injection molding of commercially available doped thermoplastic. After cleaning, the traces are built up additively in a metallization process. For example, the traces may be built up using an electroless copper bath.

Finally, the traces may be plated with nickel and flash gold. Application-specific coatings, such as Sn, Ag, Pd/Au, or organic solderability preservatives (OSP) for example, can be created.

Other methods for forming the traces may be used without departing from the present disclosure.

Figure 2:
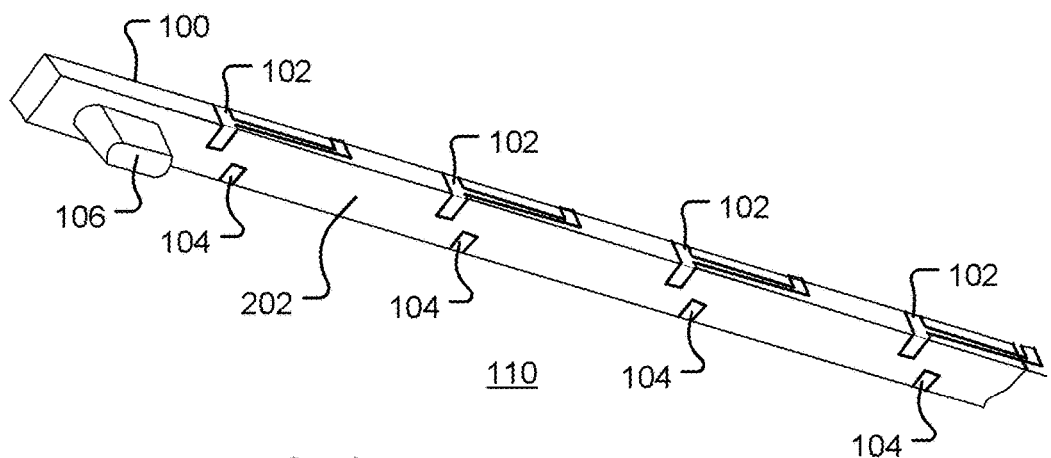
FIG. 2 is a further diagrammatic view of the touch sensing element, in accordance with exemplary embodiments of the present disclosure.

FIG. 2 is a diagrammatic view of the trace carrier 100 of FIG. 1 viewed from underneath. In the embodiment shown in FIG. 2, the traces elements 102 and 104 extend from the sensing surface to a connecting surface 202 on the underside of the trace support element 100. The traces on the connecting surface are arranged to facilitate electrical connection of the traces 102 and 104 to a capacitive sensing circuit.

Alternatively, top and bottom traces may be connected via through hole plating

In use, the trace carrier 100 may be configured couple to an electronic device at the connecting surface, such that the sensing surface extends from the electronic device.

Figure 3:
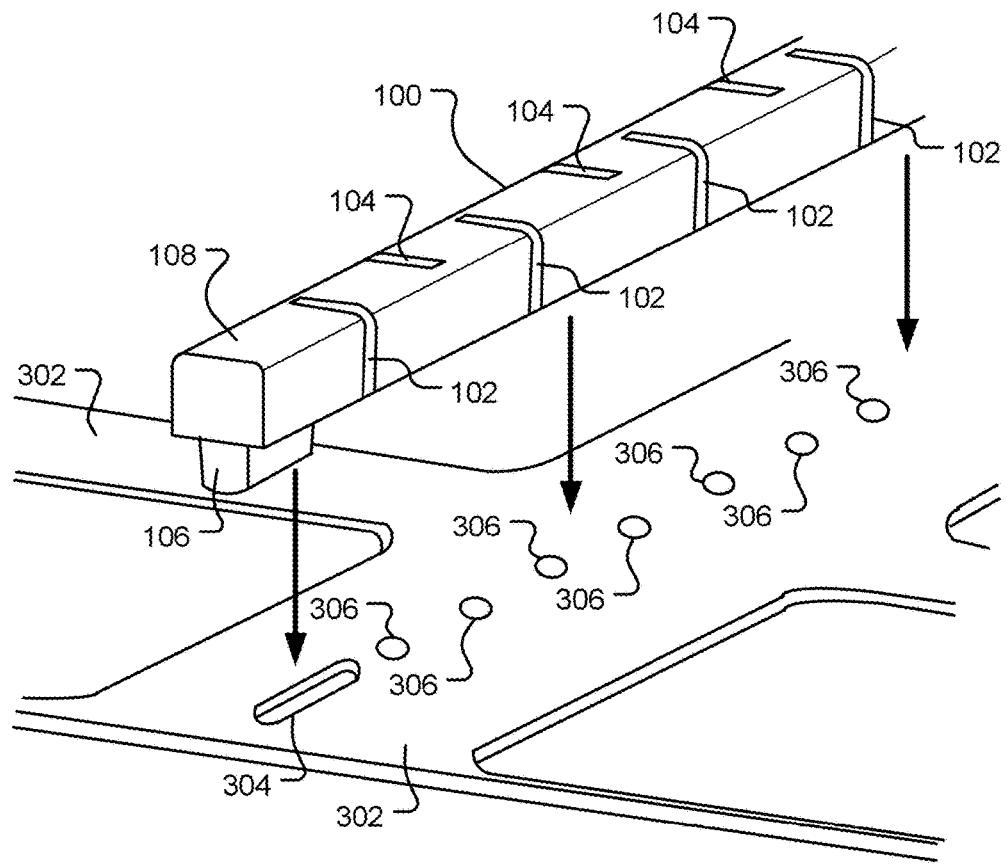
FIG. 3 is diagrammatic view of a trace carrier and a connecting structure, in accordance with exemplary embodiments of the present disclosure.

In the embodiment shown in FIG. 3, the trace carrier 100 supports a number of electrically conductive traces 102 and 104 on the sensing surface 108. The traces may be arranged in various shapes or patterns. Each trace passes from the sensing surface 108, down the sides of the trace carrier, to the connecting surface (202 in FIG. 2) under the structure 100. In the embodiment shown in FIG. 3, the trace carrier 100 may be to be mounted on a connecting structure 302 (such as flexible printed circuit, or printed circuit board, for example). Guide element 106 may be passed through slot 304 in the connecting structure 302. This ensures that electrical connection pads 306 align with traces 102 and 104 on the connecting surface of the trace carrier 100, and to fix the trace structure to attached base. At the designed locations, the traces 102 and 104 pass from sensing surface 108 on one side of the trace carrier 100 to connection points on the opposite side of the structure. The connection points align with the connection pads 306 to enable electrical connection to the capacitive sensing circuit. The connecting structure 302 may be a printed circuit on which the capacitive sensing circuit is formed. The connections to the printed circuit can be realized by various methods, such as AFC bonding, soldering or spring/Pogo pins, for example.

In the embodiment shown, the connecting structure 302 contains a number of apertures that allow other elements, such as the keycaps of a mechanical keyboard, to pass through the connecting structure to actuate the metal domes. This is discussed in more detail below.

Figure 4:
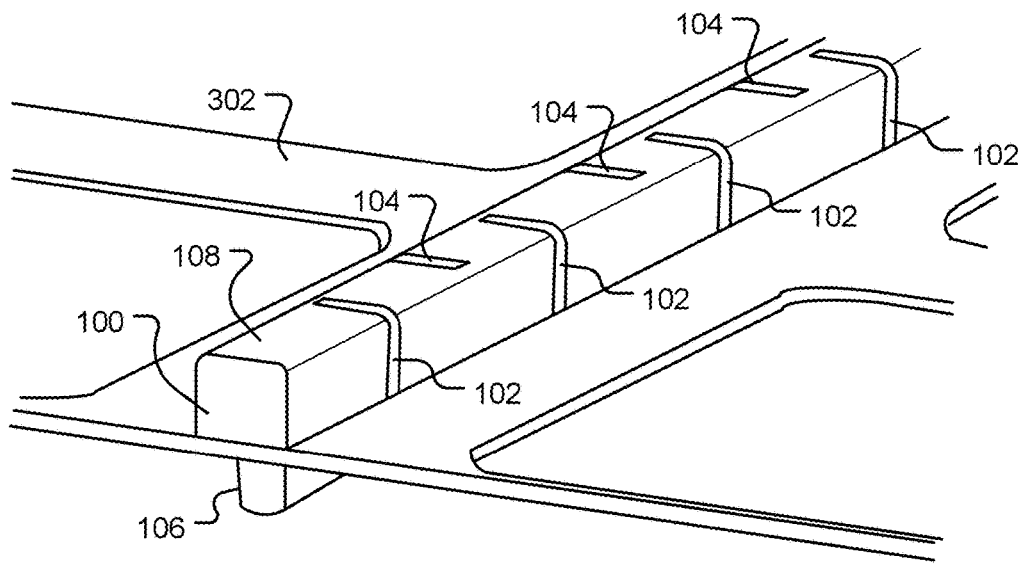
FIG. 4 is diagrammatic view of a trace carrier and a connecting structure, in accordance with exemplary embodiments of the present disclosure.

Once assembled, the trace carrier 100 may be mounted on the connecting structure 302 as shown in FIG. 4. The sensing surface 108 is raised from the surface of the connecting structure. This provides a tactile reference to the user, enabling the sensing surface to be located in poor visibility, and moves the sensing surface above any liquid or moisture that may be present on the surface of the connecting structure 302.

Figure 5:
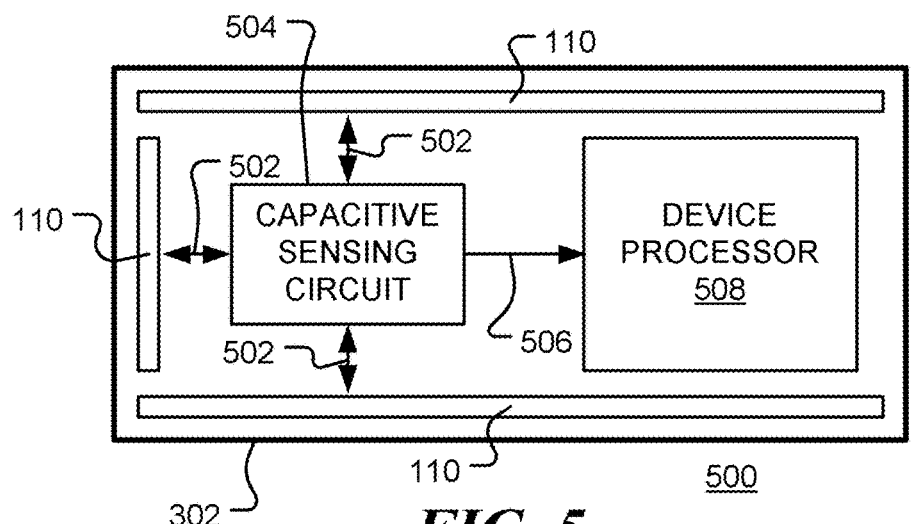
FIG. 5 is a block diagram of an electronic device incorporating a capacitive touch sensor, in accordance with exemplary embodiments of the present disclosure.

FIG. 5 is a block diagram of an electronic device 500 incorporating a capacitive touch sensor. One or more touch sensitive elements 110 are mounted on connecting structure 302. The connecting structure 302 provides connections 502 between the traces of the touch sensitive elements 110 and a capacitive sensing circuit 504. The capacitive sensing circuit 504 may be connected via connection 506 to a device processor 508 of the electronic device. The traces include both transmitting and receiving traces that are coupled, via the connecting structure 302, to the capacitive sensing circuit 504. In operation, the capacitive sensing circuit 504 senses a capacitance between the transmitting trace and the receiving trace and determines a touch position on the sensing surface dependent upon the sensed capacitance. The sensed touch position, or signals from which the sensed touch position may be determined, is passed to the device processor 508 and may be used to control operation of applications executed by the device processor or used to control peripheral devices of the electronic device 500. It is to be understood that the electronic device 500 will include other components such as clocks, memory, a display, power supply, and other peripheral devices. To aid clarity of description, such components are omitted from FIG. 5. The electronic device 500 may be, for example, a smartphone, a personal digital assistant, a handheld, mobile or desktop computer, a computer keyboard, a remote control handset, a telephone handset, a portable music player, an e-reader, a camera, or any other electronic device having a user-interface.

Figure 6:
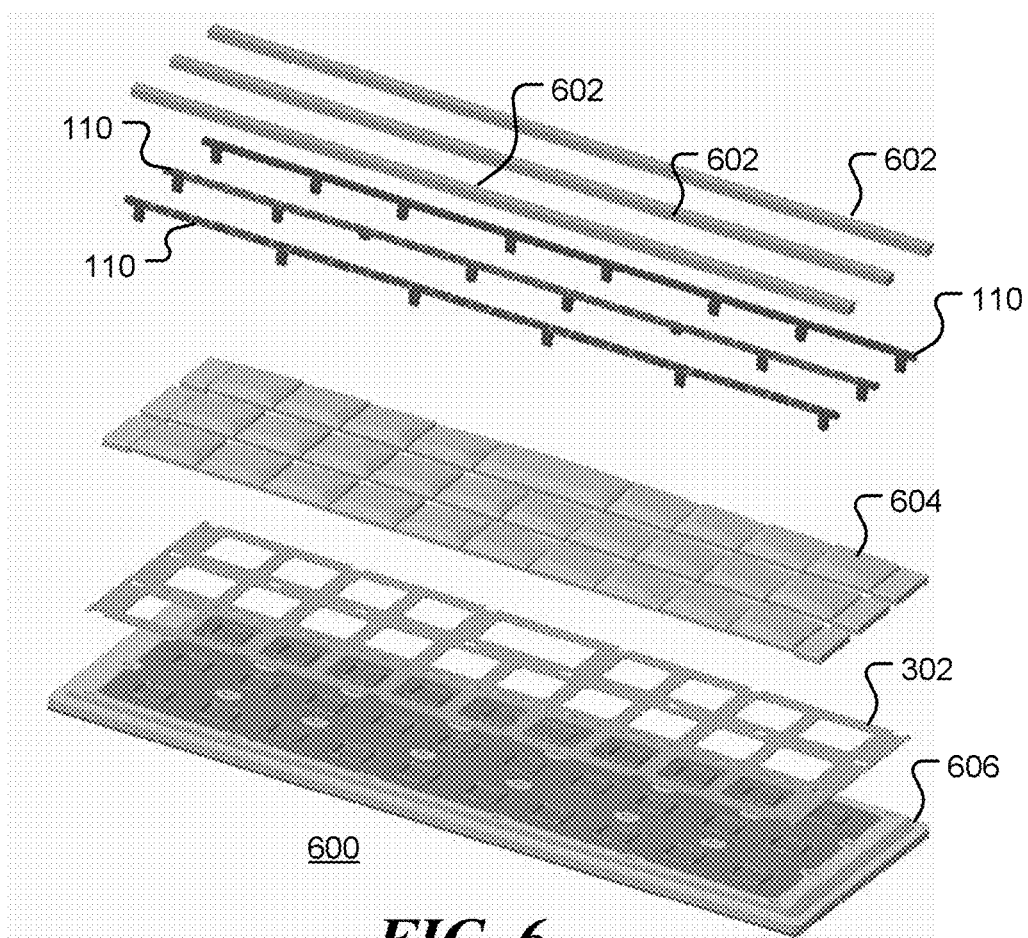
FIG. 6 is an exploded view of a touch sensitive mechanical keyboard, in accordance with exemplary embodiments of the disclosure.

FIG. 6 is an exploded view of a touch sensitive mechanical keyboard 600, in accordance with exemplary embodiments of the disclosure. In this embodiment, the touch sensitive elements 110 take the form of frets. Covers 602 overlay the sensing surface of frets to improve appearance and protect the traces. The frets are configured to be positioned between the rows of keycaps 604 of a physical keyboard. The keycaps engage switches, such as metal domes, on keypad 606. The sensing surface of each fret may be used to track one or more user finger positions on the keyboard 600. The connecting structure 302 enables the traces on the frets to be coupled to a capacitive sensing circuit (not shown). For example, the connecting structure 302 may include a flexible printed circuit (FPC), positioned below the keycaps 604, which provides an electrical connection to a capacitive sensing circuit located below the keyboard or at some other location in the electronic device. The frets 110 are shaped to fit between the keycaps 604 and may be straight or curved, for example, depending on the arrangement of the keycaps. Additional or alternative frets may be positioned between columns of keys, if the keys are so arranged.

Figure 7:
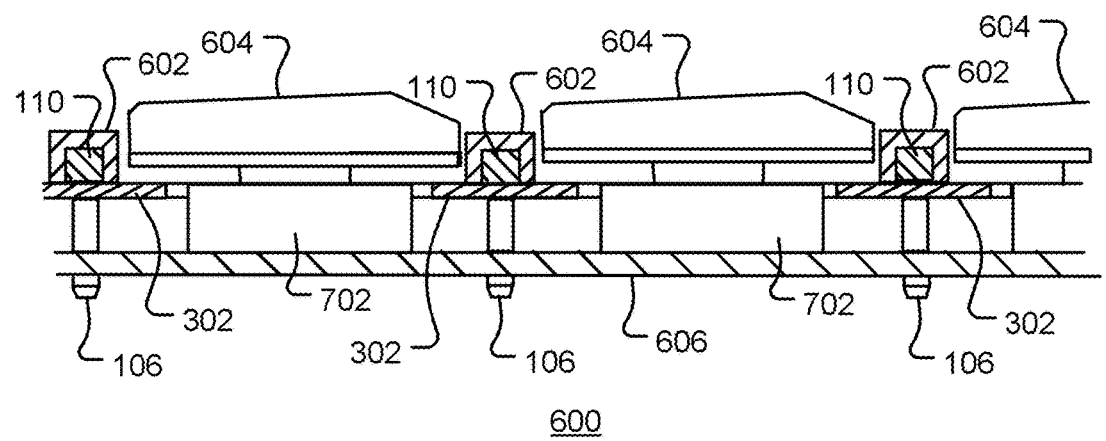
FIG. 7 is a simplified sectional view of a touch sensitive mechanical keyboard, in accordance with exemplary embodiments of the disclosure.

FIG. 7 is a simplified sectional view of a touch sensitive mechanical keyboard 600, in accordance with exemplary embodiments of the disclosure. Touch sensitive elements 110 are located between keycaps 604 of a mechanical keyboard. The keycaps engage key switches 702, such as metal domes for example, when pressed. The key switches are mounted on keypad base 606. The touch sensitive elements 110 are mounted on connecting structure 302 that provides an electrical connection between the traces of the touch sensitive elements 110 and a capacitive sensing circuit. The guide elements 106 may continue through connecting structure 302 to the keypad base 606 to provide alignment of the components and rigid connection between 110 and any supportive structure underneath the keycaps. Covers 602 overlay the sensing surface of frets to improve appearance and protect the traces. The covers 602 may extend down the sides of trace support elements, as shown, or may cover only the sensing surface. The covers 602 may be, for example, separate components, components molded onto the trace carrier after the traces have been formed, or coatings applied to the trace carrier after the traces have been formed.

Figure 8:
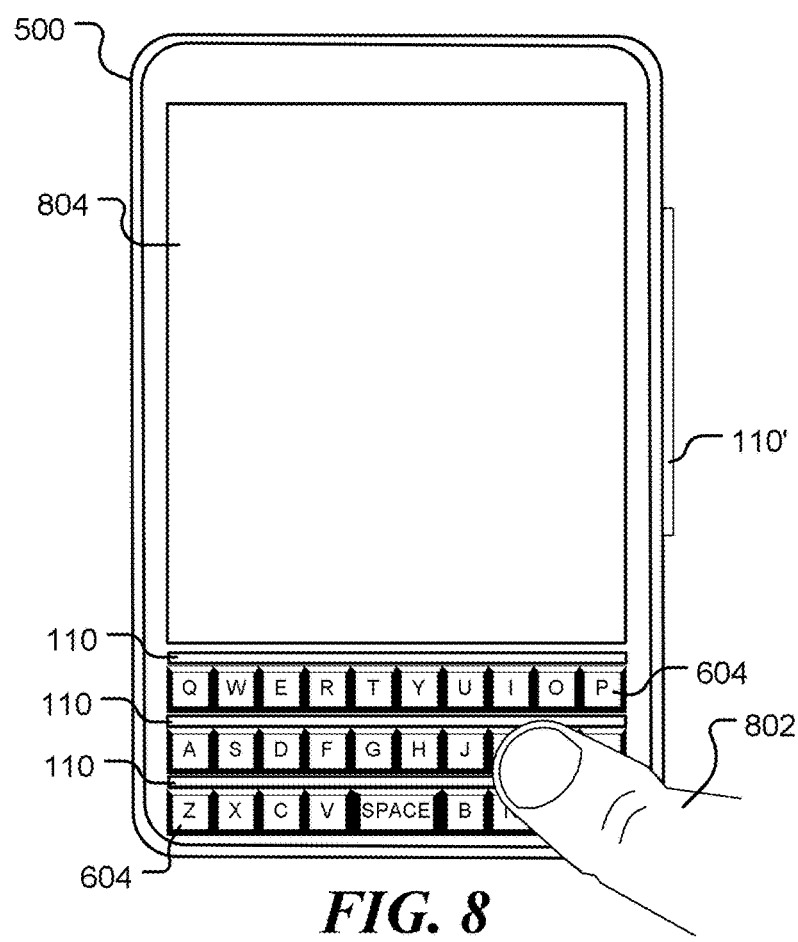
FIG. 8 is a diagrammatic view of an electronic device having a touch sensitive mechanical keyboard, in accordance with exemplary embodiments of the disclosure.

FIG. 8 is a diagrammatic view of an electronic device having a touch sensitive mechanical keyboard, in accordance with exemplary embodiments of the disclosure. In the example shown, the electronic device 500, which may be a smartphone, handheld computer, personal digital assistant, e-reader or the like, is operated by user 802. The electronic device 500 has a display 804 and a touch sensitive mechanical keyboard with keycaps 604 and touch sensitive elements 110. In operation the touch sensitive elements 110 detect the position and/or motion of the user 802 as the user's digit moves across the keyboard, while the mechanical keyboard responds to key presses on keycaps 604. In one embodiment, a touch sensitive element 110' is located separate from the keyboard. In the example shown, the touch sensitive elements 110' is located on a side of the electronic device 500 to provide 'slider like' functionality for controlling volume or scrolling menus, for example. Touch sensitive elements may be located at other locations on the electronic device.

Figure 9:
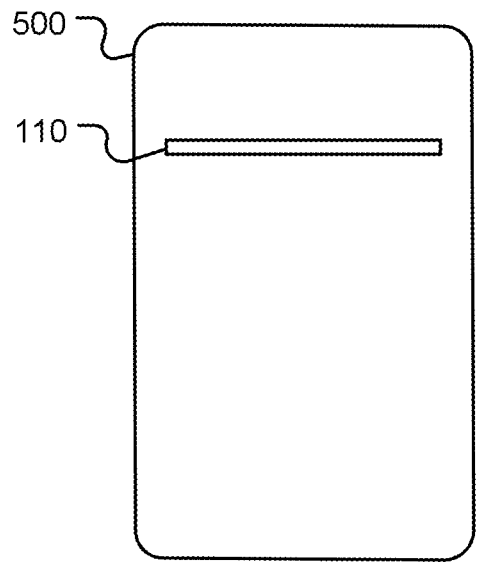
FIG. 9 is a diagrammatic view of an electronic device having a capacitive touch sensor, in accordance with exemplary embodiments of the disclosure.

FIG. 9 is a diagrammatic view of an electronic device having a capacitive touch sensor, in accordance with exemplary embodiments of the disclosure. In this embodiment, touch sensitive element 110 is located on the rear of electric device 500. So located, the touch sensitive element 110 is not visible to the user during normal operation of the electronic device. However, the touch sensitive element 110 is raised from the surface of the electronic device and may be located by touch. For example, a reader can scroll the content on the screen horizontally by sliding a digit along the element without changing their holding gesture, resulting in a more smooth experience.

Figure 10:
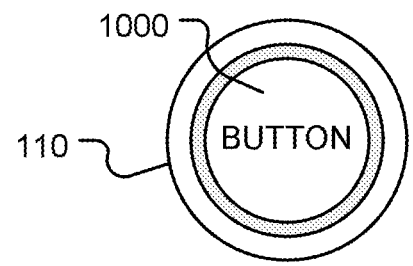
FIG. 10 is a diagrammatic view of a button with a touch sensitive surround, in accordance with exemplary embodiments of the disclosure.

FIG. 10 is a diagrammatic view of button with a touch sensitive surround, in accordance with exemplary embodiments of the disclosure. In this embodiment, the touch sensitive element 110 is circular in shape and surrounds a round button 1000, encompassing the circumference of round button 1000 as shown. In one application, the touch sensitive element 110 may be used to navigate a menu while the button is used for selection. Other arrangements will be apparent to those of ordinary skill in the art.

Figure 11:
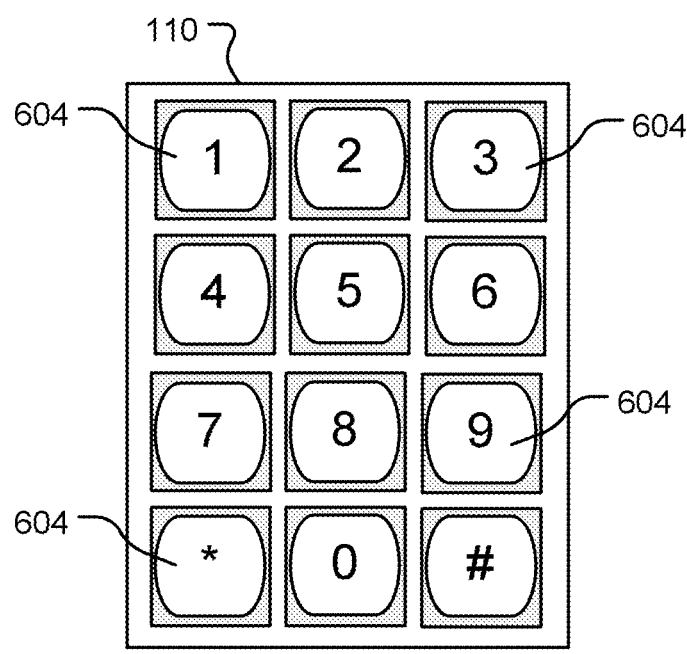
FIG. 11 is a diagrammatic view of a touch sensitive mechanical keyboard, in accordance with exemplary embodiments of the disclosure.

In a further embodiment, an example of which is shown in FIG. 11, the trace carrier may take the form of a grid, with an aperture for each key of a keypad or keyboard. In FIG. 11, the touch sensitive element 110 comprises a grid that surrounds a numeric keypad with keycaps 604. A similar grid may be used with an alpha-numeric keyboard or other collections of keys.

Figure 12:
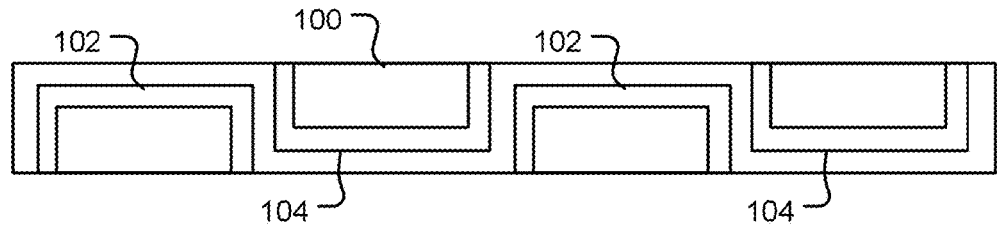
FIGS. 12-15 show example trace patterns, in accordance with exemplary embodiments of the disclosure.
Figure 13:
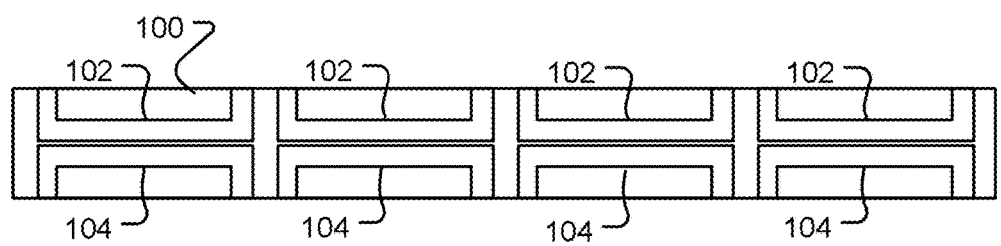
Figure 14:
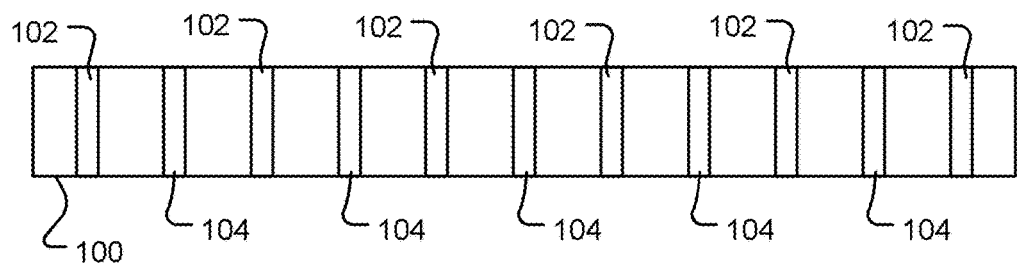
Figure 15:
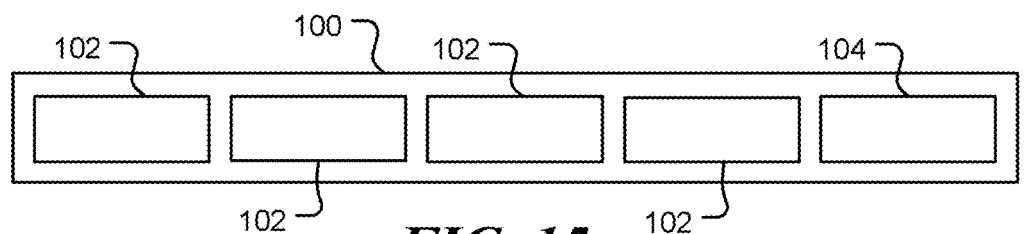

FIGS. 12-15 show example trace patterns, in accordance with exemplary embodiments of the disclosure. The figures show first traces 102 and second traces 104, that may be transmitting and receiving traces, respectively. The traces form plates of a capacitor. Positioning of an object, such as a user digit, close to the traces alters the capacitance. The change in capacitance may be monitored by a capacitance sensing circuit and used to determine the position of the object and/or motion of the object. These trace patterns are merely exemplary, and other trace patterns may be used without departing from the present disclosure. In FIGS. 12 and 13 the traces are arrange in transmitting 102 and receiving 104 pairs the form electrodes of a capacitor. In FIG. 14, the traces may be used as transmitter/receiver pairs, or as individual electrodes that enable a capacitance to electrical ground to be measured. In FIG. 15, the traces may be used as individual electrodes that enable a capacitance to electrical ground to be measured. In a further embodiment, the traces form an array of pads to enable sensing touch position in two dimensions. Each pad in the array is coupled to the sensing surface of the trace carrier, by a surface conductor or a through-hole for example, to enable connection to the capacitance sensing circuit.

Figure 16:
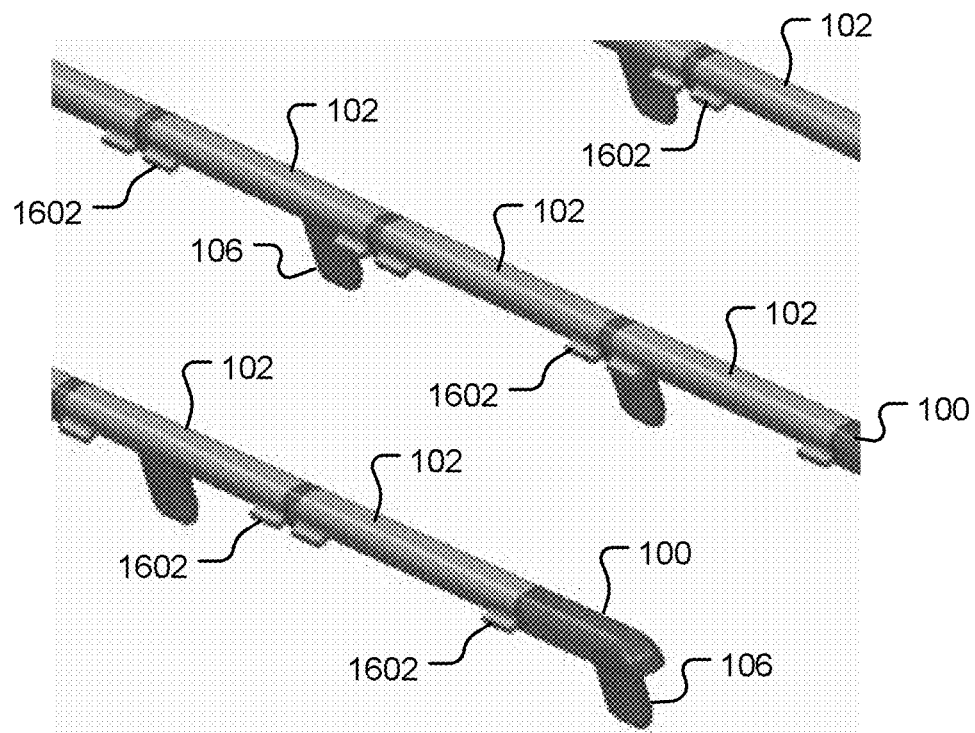
FIG. 16 is a diagrammatic view of a trace carriers with stamp metal traces, in accordance with exemplary embodiments of the disclosure.

FIG. 16 is a diagrammatic view of trace carriers with stamp metal traces, in accordance with exemplary embodiments of the disclosure. Each trace carrier 100 supports a number of traces 102 that provide conductive pads on the sensing surfaces of the trace carriers. Each pad is electrically connected to the capacitive sensing circuit that is operable to sense the capacitance between the pad and an electrical ground. Changes in the capacitance indicate that an object is close to pad. This enables a touch position to be determined. The traces 102 themselves may be formed from stamped sheet metal and bonded to the trace carriers 100. The traces may include tabs 1602 to facilitate connections to traces 102.

Figure 17:
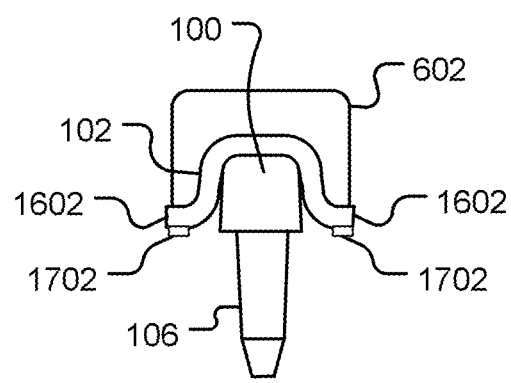
FIG. 17 is an end view of a trace carrier with stamped metal traces, in accordance with exemplary embodiments of the disclosure.

FIG. 17 is a sectional view of a trace carrier 100 with stamp metal traces 102, in accordance with exemplary embodiments of the disclosure. The traces 102 may be formed, for example, by stamping the shapes from sheet metal. Molded traces carriers 100, with guide elements 106 are then inserted. Finally a covering 602 is formed by over-molding or applying a coating, for example. Solder paste 1702 is then applied to tabs 1602 to facilitate connection to the capacitance sensing circuit, and the assembly is trimmed ready for use.

An advantage of the touch sensitive element in the above embodiments is that it provides a sensing surface that is raised above the surface beneath the keys and exposed to the user. Thus, any moisture, condensation or spilled liquid may be easily wiped off.

A further advantage is that the sensing surface is closer to the user's finger, providing greater sensitivity and accuracy.

A still further advantage of the trace carrier is that, since the sensing surface of the touch sensitive element is raised, it provides tactile feedback as to the location of the sensing surface. This has benefit when visual feedback is impaired. Examples include when the sensor is located on the rear or side of an electronic device, when a device is operated in poor lighting, when the user is visually impaired, etc.

In the embodiments shown, the sensing surface of the trace carrier is planar, or nearly so. However, the disclosure is not limited to planar sensing surfaces and non-planar, three-dimensional, sensing surfaces may be used without departing from the present disclosure.

The implementations of the present disclosure described above are intended to be merely exemplary. It will be appreciated by those of skill in the art that alterations, modifications and variations to the illustrative embodiments disclosed herein may be made without departing from the scope of the present disclosure. Moreover, selected features from one or more of the above-described embodiments may be combined to create alternative embodiments not explicitly shown and described herein.

The present disclosure may be embodied in other specific forms without departing from its spirit or essential characteristics. The described exemplary embodiments are to be considered in all respects only as illustrative and not restrictive. The scope of the disclosure is, therefore, indicated by the appended claims rather than by the foregoing description. All changes that come within the meaning and range of equivalency of the claims are to be embraced within their scope.

What is claimed is:

1. A capacitive touch sensor, comprising:
   a trace carrier having a sensing surface and a connecting surface;
   a plurality of electrically conductive traces on the trace carrier, each trace of the plurality of electrically conductive traces forming a sensing pattern on the sensing surface and each trace of the plurality of electrically conductive traces passing from the sensing surface to the connecting surface, where the plurality of electrically conductive traces comprises a transmitting trace and a receiving trace; and
   a capacitive sensing circuit operable to:
      electrically couple to the plurality of electrically conductive traces at the connecting surface of the trace carrier;
      sense a capacitance change using a first trace of the plurality of electrically conductive traces, where sensing the capacitance change comprises sensing a capacitance between the transmitting and receiving traces; and
      determine a touch position on the sensing surface dependent upon the sensed capacitance change.

2. The capacitive touch sensor of claim 1, further comprising a connecting structure configured to:
   contact the plurality of electrically conductive traces at the connecting surface of the trace carrier; and
   provide electrical connections between the capacitive sensing circuit and the plurality of electrically conductive traces.

3. The capacitive touch sensor of claim 2, where the connecting structure comprises a printed circuit and where the trace carrier is mechanically coupled to the printed circuit.

4. The capacitive touch sensor of claim 1, where the trace carrier comprises a material amenable to Laser Direct Structuring, and wherein the traces are formed by a Laser Direct Structuring process.

5. The capacitive touch sensor of claim 1, where the connecting structure comprises a flexible printed circuit.

6. The capacitive touch sensor of claim 1, wherein the trace carrier comprises a fret.

7. The capacitive touch sensor of claim 1, further comprising a cover that overlays at least the sensing surface of the trace carrier.

8. The capacitive touch sensor of claim 1, further comprising a coating that overlays at least the sensing surface of the trace carrier.

9. An input apparatus for an electronic device, comprising:
   a keyboard comprising one or more keycaps;
   a connecting structure underlying the keyboard;
   one or more trace carriers located on the connecting structure adjacent the keycaps of the keyboard, such that a sensing surface of the one or more trace carriers projects above the connecting structure and a connecting surface of trace support element engages the connecting structure;
   a plurality of electrically conductive traces on the trace carrier, each trace of the plurality of electrically conductive traces forming a sensing pattern on the sensing surface and each trace of the plurality of electrically conductive traces passing from the sensing surface to the connecting surface; and
   a capacitive sensing circuit operable to:
      electrically couple, via the connecting structure, to the plurality of electrically conductive traces at the connecting surface of the trace carrier;
      sense a capacitance change using a first trace of the plurality of electrically conductive traces;
      determine a touch position on the sensing surface dependent upon the sensed capacitance change.

10. The input apparatus of claim 9, where the trace carrier comprises a material amenable to Laser Direct Structuring, and wherein the traces are formed by a Laser Direct Structuring process.

11. The input apparatus of claim 9, where the connecting structure comprises a flexible printed circuit.

12. The input apparatus of claim 9, where the one or more keycaps comprise a plurality of keycaps arranged in rows and where at least one trace carrier of the one or more trace carriers comprises a fret sized to fit between rows of keycaps.

13. The input apparatus of claim 9, where the one or more keycaps comprise a plurality of the keycaps arranged in an array and where the trace carrier comprises a grid sized to fit between keycaps.

14. The input apparatus of claim 9, where the one or more keycaps comprise a single button and where the trace carrier surrounds the button.

15. An electronic device, comprising:
a trace carrier having a sensing surface and a connecting surface, the trace carrier located on a surface of the electronic device such that the sensing surface of the trace carrier projects from the surface of the electronic device;
a plurality of electrically conductive traces on the trace carrier, each trace of the plurality of electrically conductive traces forming a sensing pattern on the sensing surface and each trace of the plurality of electrically conductive traces passing from the sensing surface to the connecting surface, where the plurality of electrically conductive traces comprises a transmitting trace and a receiving trace; and
a capacitive sensing circuit operable to:
electrically couple to the plurality of electrically conductive traces at the connecting surface of the trace carrier;
sense a capacitance change using a first traces of the plurality of conducting traces, where sensing the capacitance change comprises sensing a capacitance between the transmitting and receiving traces; and
determine a touch position on the sensing surface dependent upon the sensed capacitance,
wherein the electronic device is responsive to the sensed capacitance.

16. The electronic device of claim 15, where the trace carrier comprises a material amenable to Laser Direct Structuring, and wherein the traces are formed by a Laser Direct Structuring process.

17. The electronic device of claim 15, where the trace carrier is located on the rear of the electronic device.

18. The electronic device of claim 15, where the trace carrier is located on a side of the electronic device.

19. The electronic device of claim 15, further comprising a mechanical keyboard have a plurality of keycaps arranged in rows, where the trace carrier comprises one or more frets located between rows of keycaps.

20. The electronic device of claim 19, further comprising a device processor responsive to the sensed capacitance and operable to determine one or more touch positions on the mechanical keyboard.

* * * * *